United States Patent [19]

Takahashi et al.

[11] Patent Number: 5,730,051
[45] Date of Patent: Mar. 24, 1998

[54] APPARATUS AND METHOD FOR CENTERING A PRINTING SCREEN OVER AN OBJECT

[75] Inventors: Ken Takahashi, Yamanashi-ken; Naoichi Chikahisa, Kofu; Takao Naito, Yamanashi-ken; Tetsuya Tanaka, Kofu, all of Japan

[73] Assignee: Matsushita Electric Industrial Co., Ltd., Kadoma, Japan

[21] Appl. No.: 378,592

[22] Filed: Jan. 26, 1995

[30] Foreign Application Priority Data

Jan. 26, 1994 [JP] Japan .................. 6-006680

[51] Int. Cl.⁶ .................. B41F 15/08; B41F 15/26
[52] U.S. Cl. .................. 101/126; 101/129; 101/DIG. 36; 33/620
[58] Field of Search .................. 101/126, 114, 101/128.4, 129, DIG. 36, 481, 485, 486; 33/619, 620, 621

[56] References Cited

U.S. PATENT DOCUMENTS

| | | | |
|---|---|---|---|
| 4,610,200 | 9/1986 | Metso | 101/126 |
| 4,672,557 | 6/1987 | Tamura et al. | 364/490 |
| 4,945,829 | 8/1990 | Ericsson | 101/126 |
| 4,981,076 | 1/1991 | Cunill | 101/127.1 |
| 5,144,899 | 9/1992 | Allen | 101/129 |
| 5,168,805 | 12/1992 | Kasanami et al. | 101/DIG. 36 |
| 5,176,078 | 1/1993 | Homma et al. | 101/126 |
| 5,226,366 | 7/1993 | Schlife et al. | 101/127.1 |

FOREIGN PATENT DOCUMENTS

| | | | |
|---|---|---|---|
| 0259776 | 3/1988 | European Pat. Off. | 101/126 |
| 0065557 | 5/1980 | Japan | 101/126 |
| 0259446 | 12/1985 | Japan | 101/DIG. 36 |
| 0130155 | 6/1991 | Japan | 101/126 |
| 4347637 | 12/1992 | Japan | 101/126 |

OTHER PUBLICATIONS

IBM Technical Disclosure Bulletin, "Semiconductor Wafer Aligner", vol. 13 No. 10, Mar. 1971.

*Primary Examiner*—Stephen R. Funk
*Attorney, Agent, or Firm*—Wenderoth, Lind & Ponack

[57] ABSTRACT

A screen printing apparatus includes: a positioning stage for positioning an object and a plate arranged above it; printing squeegees which are moved horizontally on the plate for printing through the plate onto the object; a driver for moving the positioning stage; a horizontal driver for moving the positioning stage in two substantially perpendicular directions; a positioning controller for calculating a central position of a pattern on the plate from a reference position and the size of an outer periphery of the object, moving the positioning stage so that the central position corresponds to a center of the object. A carry-in conveyor is provided for feeding the object onto the positioning stage along a predetermined transferring direction, the conveyor being arranged away from the positioning stage and having a carry-in conveyor surface on which the object is placed before the object is fed onto the positioning stage. The carry-in conveyor surface is positioned within the same plane as an object placing surface of the positioning stage. A carry-out conveyor is provided for transferring the object on the positioning stage along the transferring direction, the carry-out conveyor being arranged away from the positioning stage and having a carry-out conveyor surface on which the object is placed after the object is fed from the positioning stage. The carry-out conveyor surface is positioned within the same plane as the object placing surface of the positioning stage.

5 Claims, 6 Drawing Sheets

APPARATUS AND METHOD FOR CENTERING A PRINTING SCREEN OVER AN OBJECT

BACKGROUND OF THE INVENTION

The present invention relates to a screen printing apparatus and a screen printing method for printing a printing paste such as a cream solder or a paste used for formation of thick film circuits to obtain printed circuit boards or circuit boards of electronic components.

A screen printing apparatus referred to above has been used, for example, in a cream solder printing process when circuits of electronic components are to be mounted. With the recent tendency to provide more compact electronic devices, finer and sophisticated circuit boards are required, consequently inviting the need for the cream solder to be printed with a high degree of accuracy.

A conventional example of a screen printing apparatus will be described with reference to the drawings.

FIGS. 4 and 5 are schematic front and plan views of a conventional screen printing apparatus and FIG. 6 shows a schematic plan view of the conventional screen printing apparatus as seen downwards from the vicinity of a lower part of a screen plate.

In the screen printing apparatus in FIG. 4, a printing paste 3 such as a cream solder or the like is supplied onto a screen plate 2 where a circuit pattern 7 is attached. A positioning stage 4 for securely positioning an object 1 to be printed such as a circuit board 1 to be printed is movable upwardly and downwardly immediately below the screen plate 2. A first printing squeegee 5 for the right direction printing and a second printing squeegee 6 for the left direction printing are movable upwardly and downwardly above the screen plate 2. When the squeegee 5 or 6 is moved down, the movement is in the horizontal direction keeping touch with the screen plate 2 for the printing.

The object 1 is carried in and out to the positioning stage 4 on carry-in and carry-out conveyor belts 11 and 12. The conveyor belt 11 is composed of a front conveyor 11a and a rear conveyor 11b. Similarly, the conveyor belt 12 is composed of a front conveyor 12a and a rear conveyor 12b. The rear conveyors 11b, 12b are movable back and forth to fit the size of the object 1.

The circuit pattern 7 is attached to the screen plate 2 based on a reference position 13 which is determined in conformity with the minimum and maximum printable size of the object 1. On the other hand, the object 1 is securely positioned on the positioning stage 4 based on a reference position 14. When the object 1 is changed to an object 1', in other words, the dimension of the to-be-printed object is changed, a rear side 4b of the positioning stage 4 is moved closer to a front side 4a, and moreover, a left regulating means 15 and a right regulating means 16 are allowed to approach the reference position 14 to reduce the distance between the left and right regulating means 15, 16. In the same manner, both rear conveyors 11b and 12b are respectively moved towards the front conveyors 11a and 12a. The above reference positions 13 and 14 respectively for the circuit pattern 7 and the object 1 are set at the same position on the plane, and therefore the position of the attaching reference position 13 is determined under restrictions by the reference position 14.

The conventional screen printing apparatus constituted as above operates in a manner to be described below.

The object 1 is transferred onto the positioning stage 4 from the carry-in conveyor 11 and fixedly positioned at a predetermined position on the positioning stage 4. Subsequently, the object 1 is raised to the vicinity of the lower surface of the screen plate 2 by the positioning stage 4. The first printing squeegee 5 is moved at this time for printing of the printing paste 3 in the right direction. The second printing squeegee 6 performs printing at the next time in the left direction. After printing is finished, the positioning stage 4 is lowered to discharge the printed object 1 from the positioning stage 4 to the carry-out conveyor 12.

In spite of the fact that there are various kinds of screen plates 2 with different reference positions 13 (13a–13i) as shown in FIGS. 7A–7I, the reference position 14 for the positioning stage 4 has been fixed at the predetermined position in the conventional screen printing apparatus in FIGS. 4–6. Thus, the object 1 secured on the positioning stage 4 could not agree with the circuit pattern 7 of the screen plate 2 in many cases where such screen plates 2 are used, whereby printing is unattainable.

SUMMARY OF THE INVENTION

The object of the present invention is therefore to provide a screen printing apparatus and a screen printing method whereby a to-be-printed object secured on a positioning stage can positionally agree with a circuit pattern of a screen plate irrespective of the reference position for the circuit pattern.

In accomplishing these and other objects, according to one aspect of the present invention, there is provided a screen printing apparatus comprising: a positioning stage for fixedly positioning an object, and a plate arranged above said positioning stage; printing squeegees which are moved horizontally on said plate such that when a printing paste is applied to said plate, said printing paste is printed through said plate onto said object; a driver, said driver relatively moving said positioning stage up to a predetermined printing position in a vicinity of a lower surface of said plate; a horizontal driver, said horizontal driver moving said positioning stage in two directions which are substantially perpendicular to each other; a positioning controller, said positioning controller calculating a central position of a pattern on said plate from a reference position for attaching said pattern onto said plate and a size of an outer periphery of said object, controlling and moving said positioning stage with said horizontal driver so that said central position corresponds to a center of said object; a carry-in conveyor for feeding said object onto said positioning stage along a predetermined transferring direction, said carry-in conveyor being arranged away from said positioning stage, said carry-in conveyor having a carry-in conveyor surface on which said object is placed before said object is fed onto said positioning stage from said carry-in conveyor surface, said carry-in conveyor surface being positioned within the same plane as an object placing surface of said positioning stage, and a carry-out conveyor for transferring said object on said positioning stage along said transferring direction, said carry-out conveyor being arranged away from said positioning stage, said carry-out conveyor having a carry-out conveyor surface on which said object is placed after said object is fed from said positioning stage to said carry-out conveyor surface, said carry-out conveyor surface being positioned within the same plane as said object placing surface of said positioning stage.

According to another aspect of the present invention, there is provided a screen printing method comprising: calculating a central position of a pattern for a circuit on a plate for screen printing on the object from a reference position for attaching the pattern and a size of an outer periphery of the object; moving the positioning stage so that the central position of the pattern corresponds to a center of the object, thereby positioning the object, the positioning stage moving within a space which is defined among a carry-in conveyor for feeding the object onto the positioning stage along a predetermined transferring direction, the positioning stage, and a carry-out conveyor for transferring the object on the positioning stage along the transferring direction while an object placing surface of the positioning stage is movable within the same plane as a carry-in conveyor surface of the carry-in conveyor and a carry-out conveyor surface of the carry-out conveyor; wherein the object is placed on the carry-in conveyor surface before the object is fed onto the positioning stage from the carry-in conveyor surface; and wherein the object is placed on the carry-out conveyor surface after the object is fed from the positioning stage to the carry-out conveyor surface; and applying and printing a printing paste through the plate for screen printing onto the object and thereby forming the pattern for a circuit on the object.

According to the screen printing apparatus and the screen printing method of the invention, irrespective of the reference position for the circuit pattern on the screen plate, the to-be-printed object can be readily registered with the screen plate. Any type of screen plate becomes employable.

BRIEF DESCRIPTION OF THE DRAWINGS

These and other objects and features of the present invention will become clear from the following description taken in conjunction with one preferred embodiment thereof with reference to the accompanying drawings, in which.

DETAILED DESCRIPTION OF THE PREFERRED EMBODIMENT

Figure 1:
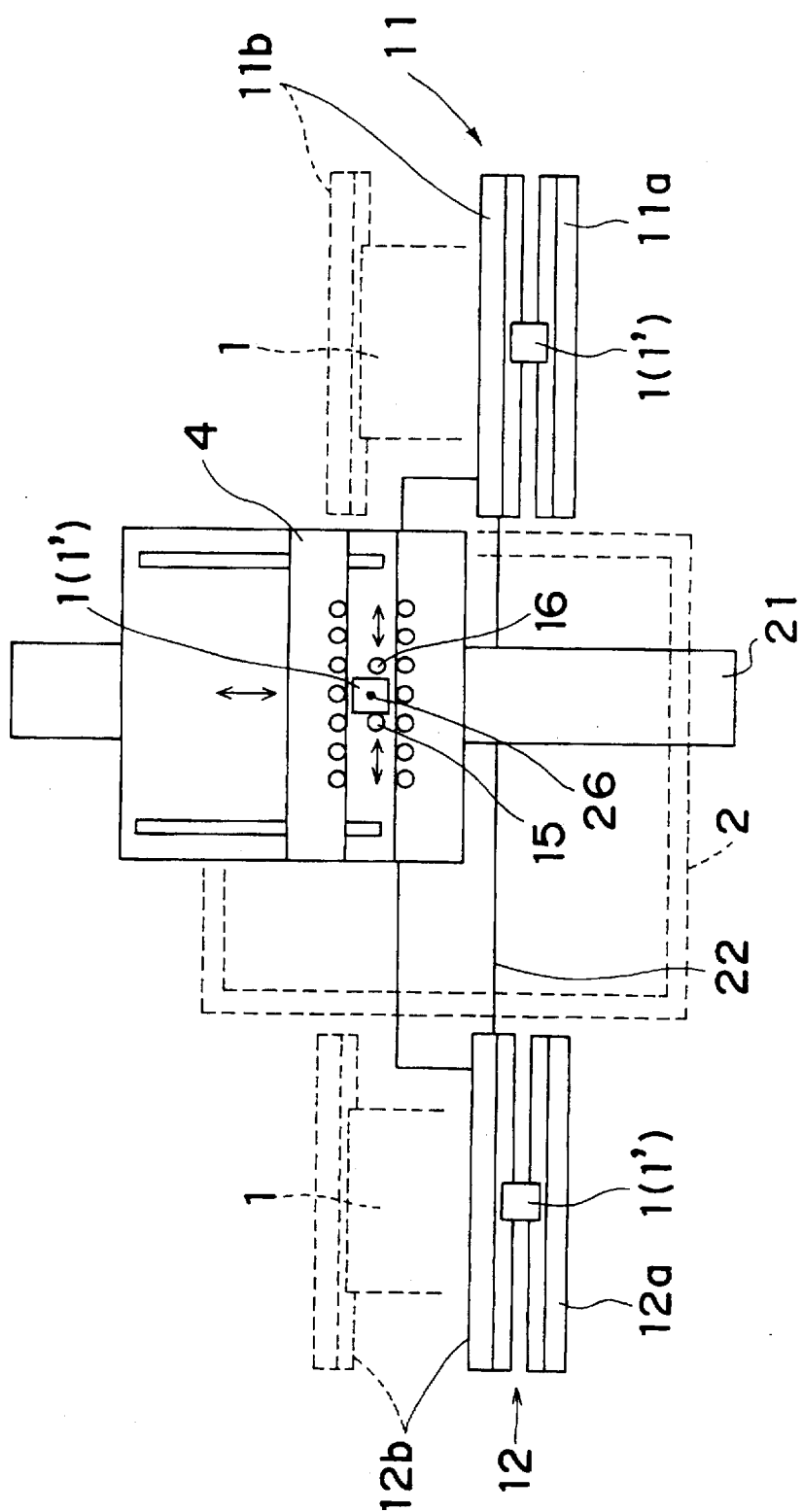
FIG. 1 is a schematic plan view of a positioning stage and the vicinity of the positioning stage in a screen printing apparatus according to an embodiment of the present invention.

Before the description of the present invention proceeds, it is to be noted that like parts are designated by like reference numerals throughout the accompanying drawings.

A screen printing apparatus according to a preferred embodiment of the present invention will be described with reference to the drawings.

Figure 2:
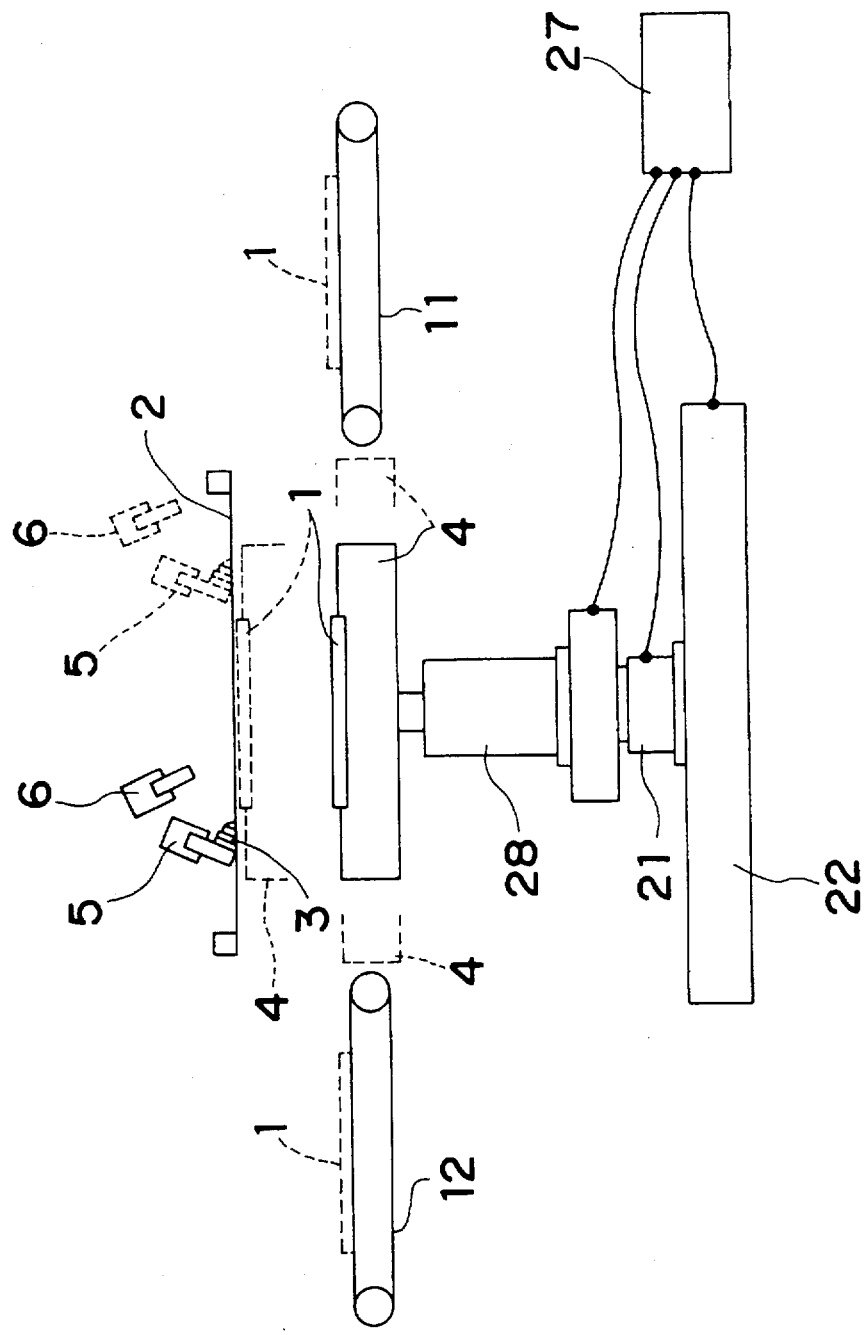
FIG. 2 is a schematic front view of the screen printing apparatus of FIG. 1.
Figure 3:
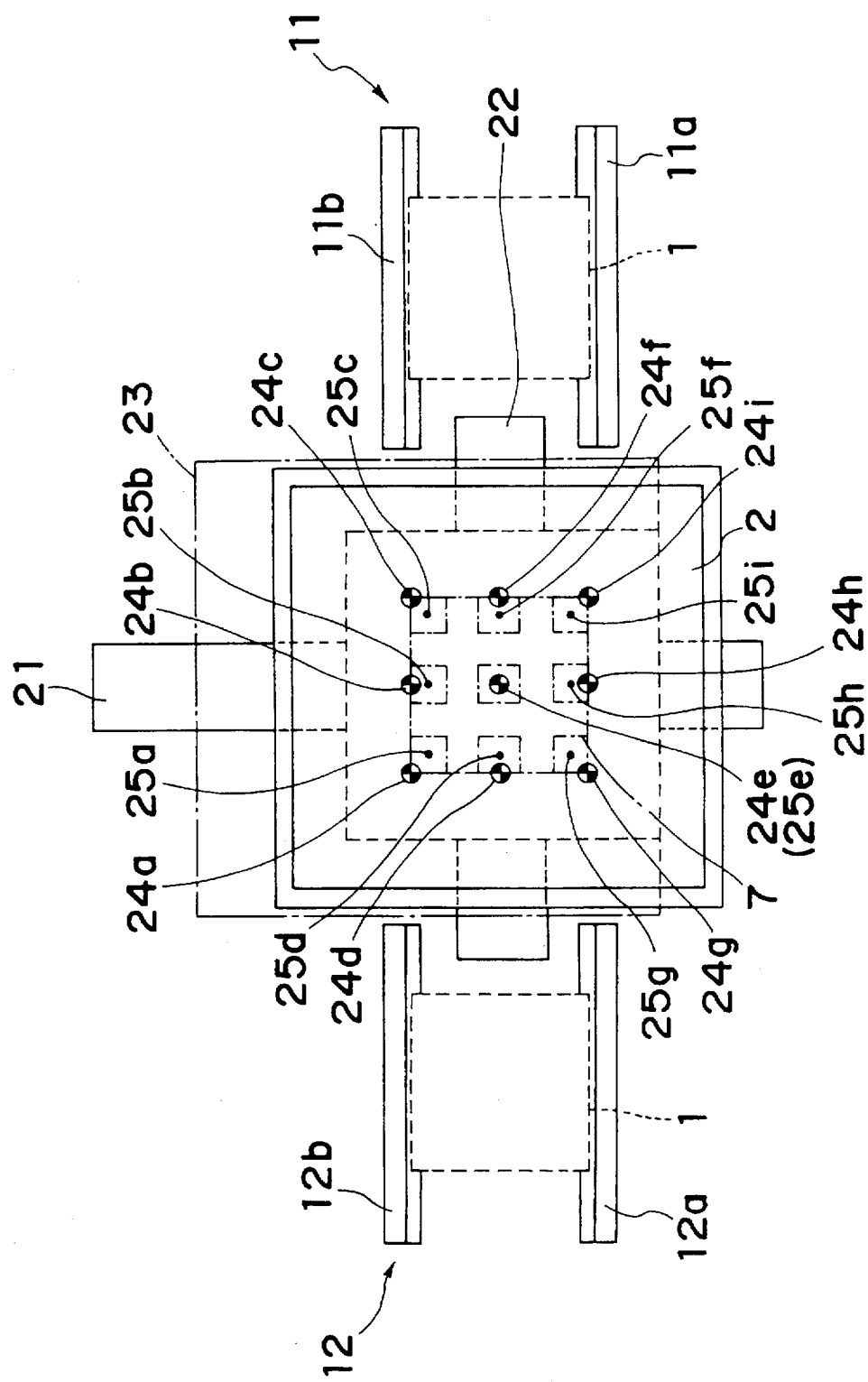
FIG. 3 is a schematic plan view of a screen plate and the vicinity thereof of the screen printing apparatus.

FIG. 1 is a schematic plan view of a positioning stage and the vicinity thereof in the screen printing apparatus according to the embodiment of the present invention. FIG. 2 is a schematic front view of the screen printing apparatus, and FIG. 3 is a schematic plan view of a screen plate and the vicinity thereof of the screen printing apparatus. The parts with the same function as those of the conventional screen printing apparatus are denoted by the same reference numerals, and the description of these parts will be abbreviated here. The detailed description of the operation of these parts will also be simplified.

Figure 4:
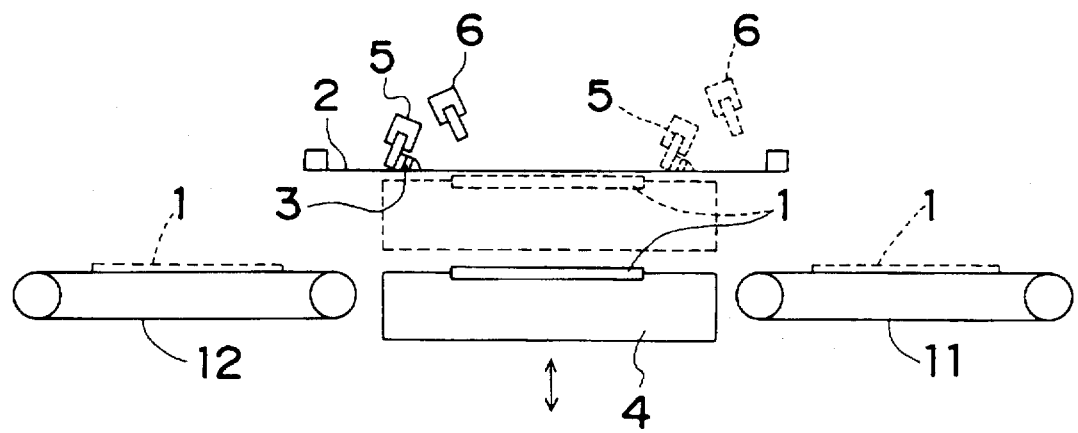
FIG. 4 is a schematic front view of a conventional screen printing apparatus.
Figure 5:
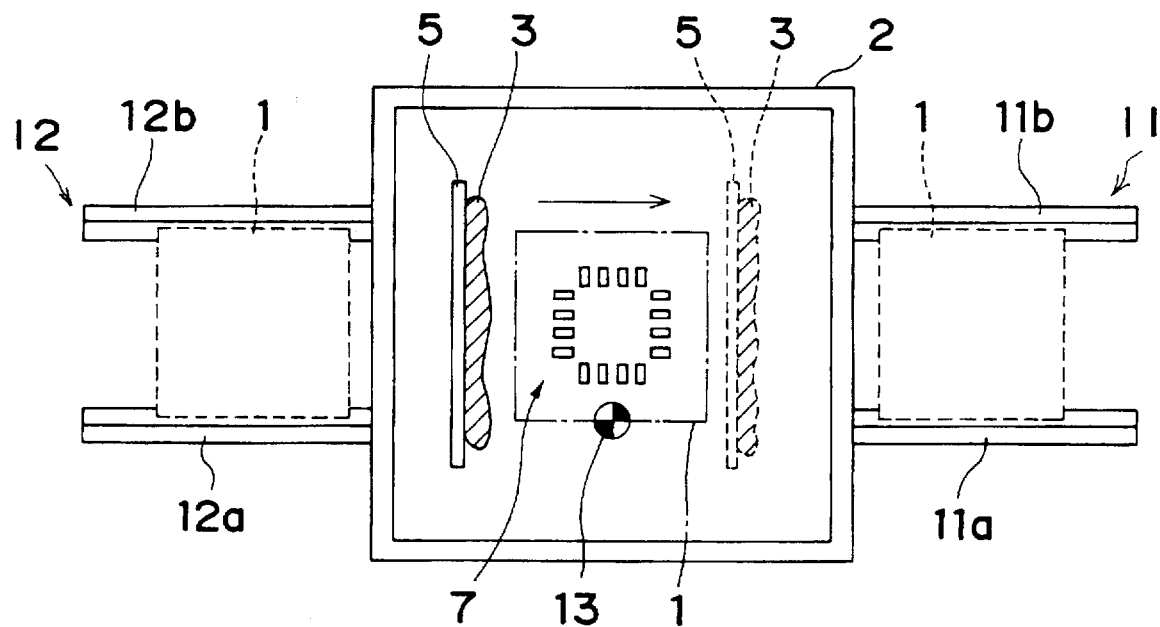
FIG. 5 is a schematic plan view of the conventional screen printing apparatus.
Figure 6:
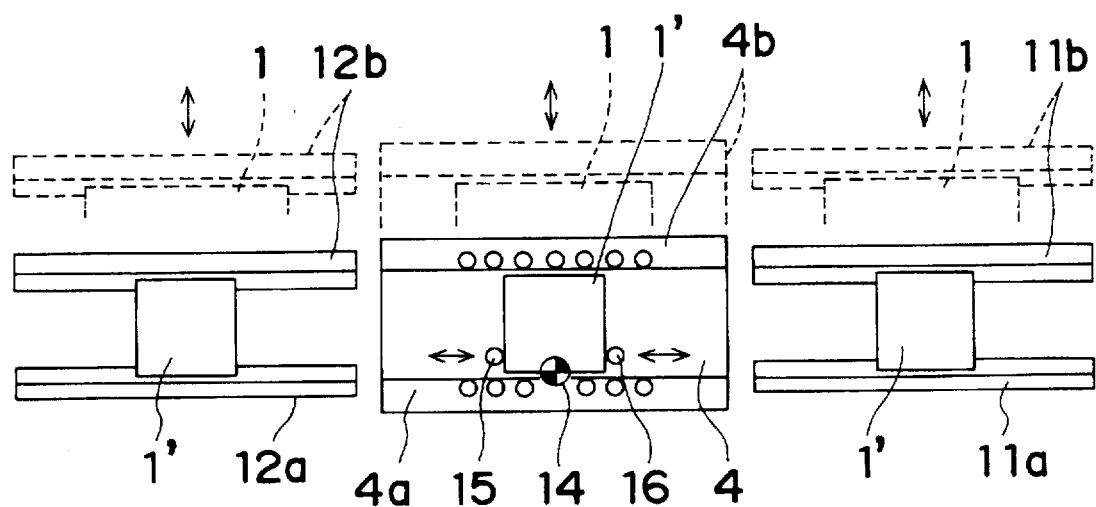
FIG. 6 is a schematic plan view seen downwards from the vicinity of the lower part of a screen plate of the conventional screen printing apparatus.
Figure 7A:
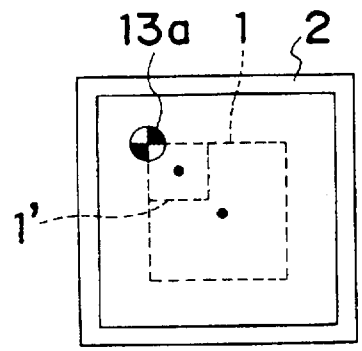
FIGS. 7A, 7B, 7C, 7D, 7E, 7F, 7G, 7H, and 7I are plan views respectively showing reference positions to attach circuit patterns to the screen plates in the screen printing apparatus.
Figure 7B:
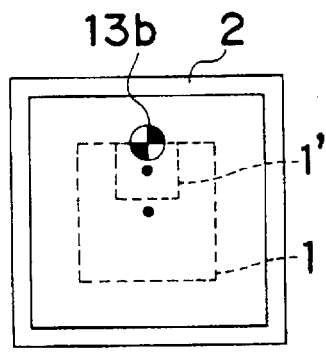
Figure 7C:
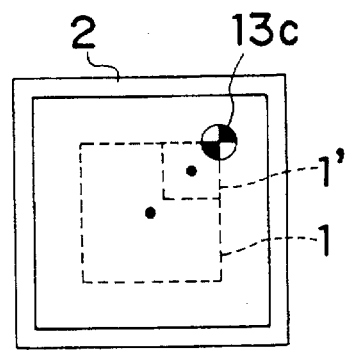
Figure 7D:
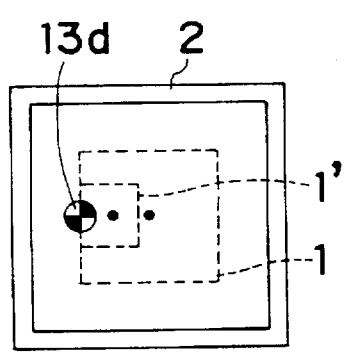
Figure 7E:
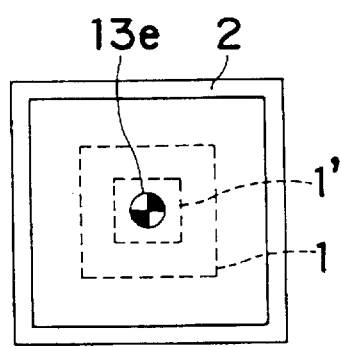
Figure 7F:
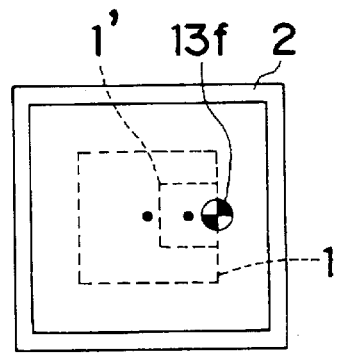
Figure 7G:
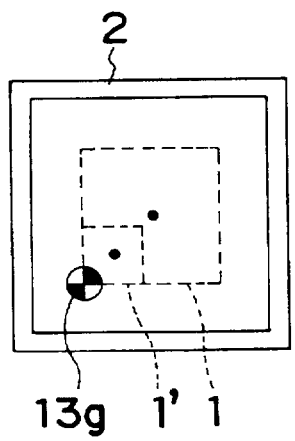
Figure 7H:
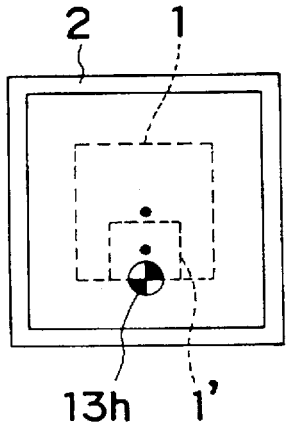
Figure 7I:
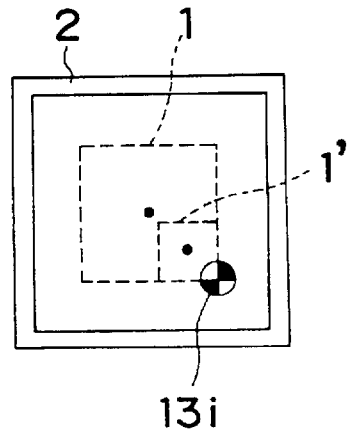

In addition to the parts of the conventional screen printing apparatus, the present screen printing apparatus is provided with a driver 21 for moving the positioning stage 4 in a direction orthogonal to the transferring direction, namely, in the back-and-forth direction, and a driver 22 for moving the positioning stage 4 between the carry-in and carry-out conveyors 11 and 12 in the transferring direction, i.e., in the right-and-left direction. The positioning stage 4 is movable in a range in the horizontal direction as indicated by a reference numeral 23 in FIG. 3. Reference numerals 24a–24i in FIG. 3 denote reference positions for the circuit patterns 7 to be attached to the screen plate 2, and reference numerals 25a–25i indicate the central positions of the circuit patterns 7. A reference numeral 26 denotes the central position of the object 1. It is to be noted here that the central positions 25a–25i of the circuit patterns 7 and the central position 26 of the object 1 correspond to the object 1 of the minimum printable size (object 1' in FIGS. 4–6). The positioning stage 4 is moved up and down to a predetermined printing position in the vicinity of the lower surface of the screen plate 2 by a lifter 28.

Besides the function in the conventional apparatus, a controller 27 calculates the central positions 25a–25i of the circuit patterns 7 on the screen plate 2 from the reference positions 24a–24i of the circuit patterns 7 and the size of the object 1, thus outputting an instruction to move the positioning stage 4 by the drivers 21 and 22 so that the central positions 25a–25i of the circuit patterns 7 correspond to the central position 26 of the object 1.

Now, the operation of the screen printing apparatus will be described.

After the positioning stage 4 is moved towards the carry-in conveyor 11, the object 1 is transferred onto the positioning stage 4 and fixedly positioned. In accordance with the instruction from the controller 27, the positioning stage 4 is then moved and positioned by the drivers 21 and 22 in the back-and-forth direction and also in the right-and-left direction so as to make one of the central positions 25a–25i of the circuit patterns 7 correspond to the central position 26 of the object 1. FIG. 1 shows the state where the positioning stage 4 is positioned to the circuit pattern 7 with the reference position 24c. Thereafter, the object 1 is moved up to immediately below the screen plate 2 by the lifters 28. Printing is started and the printing paste 3 is applied and printed. After completion of printing, the positioning stage 4 is brought near to the carry-out conveyor 12 and the printed object 1 is discharged outside thereto.

In the manner as described hereinabove, when the pattern 7 is attached to the screen plate 2 at any one of the reference positions 24a–24i, the circuit pattern can be positioned with ease before printing.

According to the present invention, while the positioning stage is moved approximately in the transferring direction or in a direction approximately orthogonal to the transferring direction by the horizontal drivers between the carry-in and carry-out conveyors, the central position of the circuit pattern on the screen plate is operated from the reference position of the circuit pattern and the size of the to-be-printed object, so that the to-be-printed object is positioned properly with respect to the central position of the circuit pattern. Therefore, a screen plate having the circuit pattern disposed at any reference position can be used, the to-be-printed object is easily positioned and printing is conducted without difficulty.

Although the present invention has been fully described in connection with the preferred embodiment thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A screen printing method comprising:

calculating a central position of a pattern for a circuit on a plate for screen printing on an object from a reference position at which the pattern is attached to the plate, irrespective of the specific reference position on the plate and a size of an outer periphery of the object which corresponds to the size of the pattern;

moving a positioning stage so that the central position of the pattern corresponds to a center of the object fixed on the stage, thereby positioning the object, the positioning stage moving within a space which is defined among a carry-in conveyor for feeding the object onto the positioning stage along a predetermined transferring direction, and a carry-out conveyor for transferring the object on the positioning stage along the transferring direction while an object placing surface of the positioning stage is movable within the same plane as a carry-in conveyor surface of the carry-in conveyor and a carry-out conveyor surface of the carry-out conveyor, wherein the object is placed on the carry-in conveyor surface before the object is fed onto the positioning stage from the carry-in conveyor surface; and applying a printing paste through the plate for screen printing onto the object and thereby forming the pattern for a circuit on the object.

2. The screen printing method as claimed in claim 1, further comprising:

transferring the object onto the positioning stage from the carry-in conveyor surface, the transferring being performed prior to the step of applying a printing paste; and transferring the object from the positioning stage to the carry-out conveyor surface, the transferring being performed subsequent to the step of applying a printing paste.

3. The screen printing method as claimed in claim 1, wherein the object is placed on the carry-out conveyor surface after the object is fed from the positioning stage to the carry-out conveyor surface.

4. A screen printing apparatus comprising:

a positioning stage for fixedly positioning an object;

a plate arranged above said positioning stage;

a plurality of printing squeegees which are movable horizontally on said plate such that when a printing paste is applied to said plate, said printing paste is printed through said plate onto the object;

a lifter for moving said positioning stage to a predetermined printing position in a vicinity of a lower surface of said plate;

a plurality of horizontal drivers connected to said positioning stage for moving said positioning stage in two directions which are substantially perpendicular to each other;

a positioning controller for calculating a central position of a pattern on said plate from only one reference position and a size of an outer periphery of the object which corresponds to the size of the pattern, said positioning controller being capable of controlling said horizontal drivers to move said positioning stage so that said central position corresponds to a center of the object, wherein said only one reference position is the position at which the pattern is attached to said plate;

a carry-in conveyor for feeding the object onto said positioning stage along a predetermined transferring direction, said carry-in conveyor being arranged away from said positioning stage, said carry-in conveyor having a carry-in object support surface on which the object is placed before the object is fed onto said positioning stage from said carry-in object support surface, said carry-in object support surface being positioned within the same plane as an object support surface of said positioning stage; and a carry-out conveyor for transferring the object on said positioning stage along said transferring direction, said carry-out conveyor being arranged away from said positioning stage, said carry-out conveyor having a carry-out object support surface on which the object is placed after the object is fed from said positioning stage to said carry-out object support surface, said carry-out object support surface being positioned within the same plane as said object support surface of said positioning stage.

5. The screen printing apparatus as claimed in claim 4, wherein one of said two directions in which said horizontal drivers move said positioning stage is parallel to said transferring direction between said carry-in and carry-out conveyors, and the other of said two directions is orthogonal to said transferring direction.

* * * * *